United States Patent [19]
Fujii et al.

[11] Patent Number: 5,674,597
[45] Date of Patent: Oct. 7, 1997

[54] ORGANIC ELECTROLUMINESCENT ELEMENTS

[75] Inventors: Takanori Fujii; Takeshi Sano; Masayuki Fujita; Yuji Hamada; Kosuke Takeuchi, all of Osaka; Kenichi Shibata, Wakayama, all of Japan

[73] Assignee: Sanyo Electric Co., Ltd., Moriguchi, Japan

[21] Appl. No.: 372,768

[22] Filed: Jan. 13, 1995

[30] Foreign Application Priority Data

Jul. 14, 1994 [JP] Japan .................. 6-162258

[51] Int. Cl.$^6$ ................ B32B 7/02; H05B 33/02
[52] U.S. Cl. .............. 428/212; 428/457; 428/690; 428/917; 313/504; 313/506
[58] Field of Search ................... 428/690, 917, 428/457, 689, 704, 212; 313/502, 504, 506

[56] References Cited
U.S. PATENT DOCUMENTS

| | | |
|---|---|---|
| 5,093,698 | 3/1992 | Egusa .................... 357/17 |
| 5,343,050 | 8/1994 | Egusa et al. .............. 257/40 |

*Primary Examiner*—Patrick Ryan
*Assistant Examiner*—Marie R. Yamnitzky
*Attorney, Agent, or Firm*—Merchant, Gould, Smith, Edell, Welter, & Schmidt, P.A.

[57] ABSTRACT

Organic electroluminescent elements capable of operating at a low driving voltage, leading to saving of electric power and operating cost for a driving circuit. In an organic electroluminescent element in which a hole transport layer and a luminous layer are formed between a hole injecting electrode layer and an electron injecting electrode layer which are oppositely arranged in a pair and in which the hole transport layer is overlaid on the hole injecting electrode layer, the hole transport layer is doped with a hole injection material at least at a region near the interface between the hole transport layer and a hole injecting electrode. The hole injection material has an ionization potential which is lower than that of the material of the hole transport layer and higher than that of the material of the hole injecting electrode layer.

17 Claims, 5 Drawing Sheets

ORGANIC ELECTROLUMINESCENT ELEMENTS

BACKGROUND OF THE INVENTION (1) Field of the Invention

The present invention relates to organic EL (electroluminescent) elements.

(2) Description of the Related Art

As information systems are more and more diversified, there have been increasing demands for flat display elements which consume less electric power and occupy less space than CRTs (cathode-ray-tubes). In such circumstances, electroluminescent elements (hereinafter referred to as "EL elements") receive much attention. EL elements are generally classified into "inorganic EL elements" or "organic EL elements", according to their materials. The inorganic EL elements are of "the collision type" in which excited emission is caused by collisions between accelerated electrons and the emission center. The organic EL elements, on the other hands, are of "the injection type" and emit when electrons injected from an electron injecting electrode (cathode) recombine with holes injected from a hole injecting electrode (anode) within a luminous layer including fluorescent materials.

Since the emission principle of the organic EL elements differs from that of the inorganic EL elements, the former have an advantage over the latter in that they require a lower driving voltage. Specifically, the organic EL elements operate at about 5 to 20 volts, whilst the inorganic EL elements operate at about 100 to 200 volts. Another advantage of the organic EL elements is that they can emit three primary colors, by selectively using fluorescent materials for their luminous layers and this would enable full-color display units.

The organic EL elements are classified either as three-layer structured elements or two-layer structured elements, depending on their structures comprised of a combination of a luminous layer and carrier transport layers.

A typical three-layer structured element is known as a DH (Double Heterojunction) structured element and comprised of a hole transport layer, a luminous layer and an electron transport layer, these layers being bonded in this order. More concretely, a hole injecting electrode (anode), a hole transport layer, a luminous layer, an electron transport layer and an electron injecting electrode (cathode) are bonded to one another and laminated on a substrate such as glass.

A typical two-layer structured element is a SH-A (Single Heterojunction-A) structured element comprising a hole transport layer and a luminous layer. Generally, a hole injecting electrode layer, a hole transport layer, a luminous layer and an electron injecting electrode layer are bonded to one another and laminated on a substrate such as glass.

There is another type of two-layer structured element which is known as a SH-B (Single Heterojunction-B) structured. element comprising a luminous layer and an electron transport layer. The element of this type is generally made up of a hole injecting electrode, a luminous layer, an electron transport layer, an electron injecting electrode, which are bonded to one another and laminated in the recited older.

The layers constituting such organic EL elements are made of the following materials: The hole injecting electrode is made from an electrode material having a high ionization potential, such as Au (gold) or ITO (In-Sn Oxide). The electron injecting electrode is made from an electrode material having a low ionization potential, such as Mg (magnesium). The hole transport layer needs the property of supplying holes and therefore it is made from a material possessing the characteristics of a p-type semiconductor. The electron transport layer needs the property of supplying electrons and therefore it is made from a material possessing the characteristics of an n-type semiconductor.

The luminous layer is generally made from a fluorescent material such as a quinoline complex. More precisely, the luminous layer in the SH-A structured element is made from an n-type material because it is required to also function as the electron transport layer, whilst the luminous layer in the SH-B structured element is made from a p-type material because of the necessity to function as the hole transport layer. The luminous layer in the three-layer structured element structured element) is made from a neutral-type material.

Of the hole transport layer, the luminous layer and the electron transport layer in any type of organic EL element, at least one layer is made from an organic material.

As mentioned earlier, there are several types of organic EL elements, but all of them have the same emission principle, that is, they emit due to the recombination of holes injected from the hole injecting electrode and electrons injected from the electron injecting electrode. This recombination takes place within the luminous layer at a region near the interface between the luminous layer and the carrier transport layer (i.e., the interface between the luminous layer and the hole transport layer or between the luminous layer and the electron transport layer).

Although the organic EL elements advantageously operate at a low driving voltage as compared to the inorganic EL elements, they require further reduction in driving voltage in order to come in to practical use.

In order to inject holes and electrons from their respective electrodes for recombination in an organic EL element, these carriers have to move across the interface between the electrode (hole or electron injecting electrode) and the carrier transport layer (hole or electron transport layer) or the luminous layer, and across the interface between the carrier transport layer and the luminous layer. When carriers move across such interfaces (i.e., when carrier movement between layers takes place), they have to cross energy barriers. Therefore, as energy barriers become larger, the carrier movement between layers is less likely to occur, resulting in a higher driving voltage.

There has been an attempt for reducing the driving voltage, in which a hole injecting layer made from a material having a lower ionization potential than that of the hole transport layer is independently provided between the hole injecting electrode and the hole transport layer, thereby making the barrier to hole injection small. Such a proposal is set out, for example, in Japanese Patent Publication Laid Open No. 4-320483 (1992). This publication discloses a technique for reducing the driving voltage by the use of a hydrazone compound as a material for the hole injecting layer.

The provision of the hole injecting layer has, however, proved to be rather impractical, since the material of the hole injecting layer has to satisfy the following conditions and therefore is selected from a very limited range: (1) the material can be used in the form of a uniform thin film; (2) the material should have electrically high hole movability; (3) when used as an optical light emitting element, the material should exhibit low absorbability for visible radiation; (4) when the material is formed into a layer, only a few grain boundaries which disturb the movement of carriers should be created within the layer; and (5) the material should possess stable characteristics so that crystallization does not progress after it has been formed into a layer.

SUMMARY OF THE INVENTION

The invention has been made with the foregoing problems in view and therefore one of the objects of the invention is to provide an organic EL element capable of operating at a lower driving voltage, leading to saving of electric power and operating cost for a driving circuit.

In accomplishing this and other objects, there is provided, according to the invention, an organic EL element comprising a hole transport layer and a luminous layer between a hole injecting electrode layer and an electron injecting electrode layer which are oppositely arranged in a pair, the hole transport layer being overlaid on the hole injecting electrode layer, wherein the hole transport layer is doped with a hole injection material at least at a region near the interface between the hole transport layer and a hole injecting electrode, the hole injection material having an ionization potential which is lower than that of the material of the hole transport layer and higher than that of the material of the hole injecting electrode layer.

In the above-described organic EL element, holes can be readily injected to the hole transport layer from the electrode layer, so that the driving voltage necessary for emission in the element can be reduced, resulting in saving of electric power and operating cost for a driving circuit.

Since the hole injection material is added into the hole transport layer, there is no need to form a thin film from the hole injection material. Therefore, high hole movability required when the material is formed into a thin film is no longer necessary. Further, the hole injection material may be a material prone to crystallization or may absorb visible radiation.

Accordingly, the hole injection material of the invention does not need to meet the conditions as required for the prior art, and therefore can be selected from a broad range without a difficulty.

This and the other objects can be fulfilled by an organic electroluminescent element comprising a luminous layer and an electron transport layer between a hole injecting electrode layer and an electron injecting electrode layer which are oppositely arranged in a pair, the luminous layer being overlaid on the hole injecting electrode layer, wherein the luminous layer is doped with a hole injection material at least at a region near the interface between the luminous layer and a hole injecting electrode, the hole injection material having an ionization potential which is lower than that of the material of the luminous layer and higher than that of the material of the hole injecting electrode layer.

In consequence, the use of the organic EL elements of the invention enables high-performance flat panel displays, back lights for liquid-crystal displays, and similar devices.

BRIEF DESCRIPTION OF THE DRAWINGS

These and other objects, advantages and features of the invention will become apparent from the following description thereof taken in conjunction with the accompanying drawings which illustrate specific embodiments of the invention. In the drawings.

DESCRIPTION OF THE PREFERRED EMBODIMENTS

According to the invention, a mechanism for reducing the driving voltage of an organic EL element will be hereinafter described.

Figure 1:
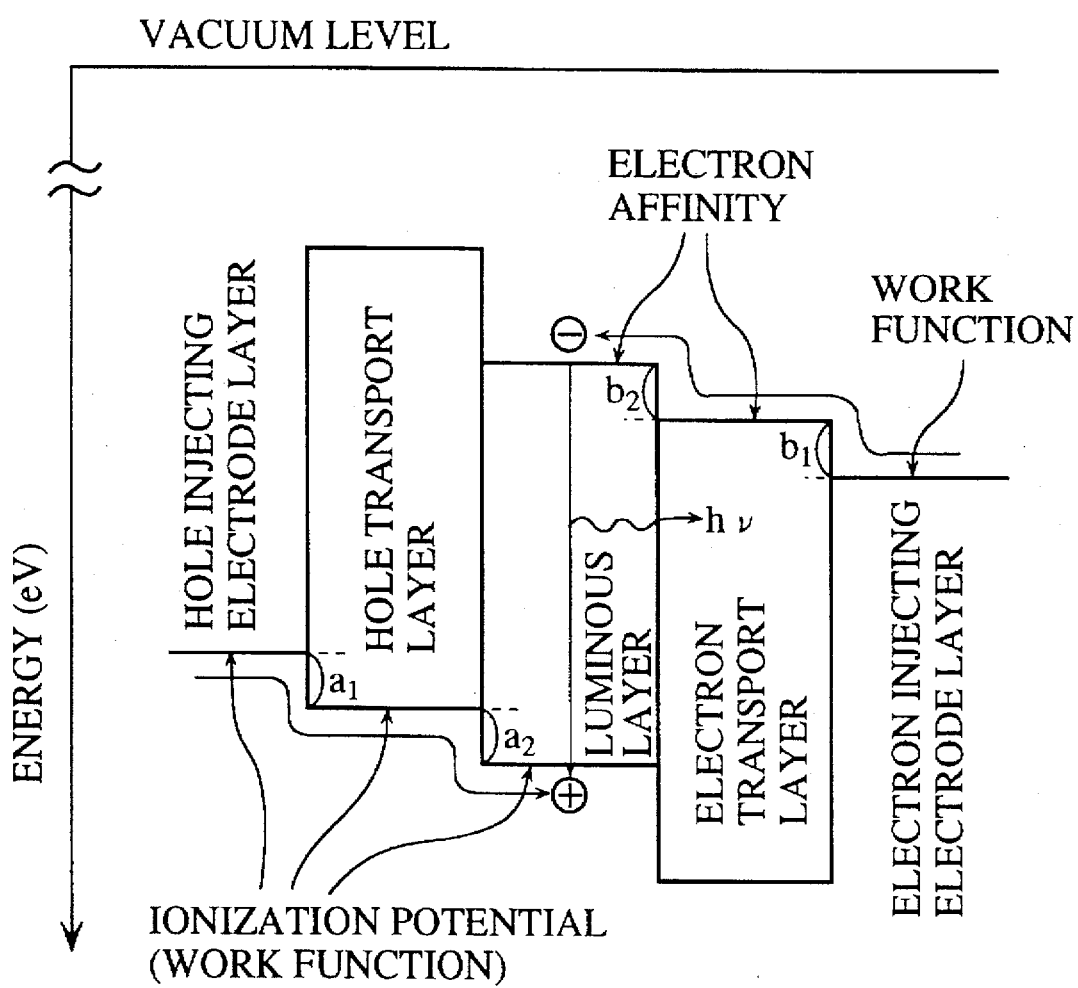
FIG. 1 is a diagram illustrating the energy state of a conventional organic EL element of the DH structure.

FIG. 1 shows the energy state of a conventional organic EL element of the DH structure. As mentioned earlier, the emission of an organic EL element is caused by the recombination of holes and electrons within the luminous layer, these carriers being injected from their respective electrode layers.

In order for holes and electrons to enter the luminous layer, they have to move, crossing energy barriers a1, a2, b1, b2. As shown in FIG. 1, these energy barriers a1, a2, b1, b2 exist at the interfaces between the hole injecting electrode layer and the hole transport layer; between the hole transport layer and the luminous layer; between the electron injecting electrode layer and the electron transport layer; and between the electron transport layer and the luminous layer, respectively. Note that although FIG. 1 shows an organic EL element of the DH structure, it is apparent that similar energy barriers exist between the layers of a SH-A structured organic EL element and a SH-B structured organic EL element.

When the moving carriers are holes, the factor which determines the characteristics of such energy barriers is the differences among the ionization potentials of the materials of the electrode layer, the carrier transport layer and the carrier transport layer. In the case of electrons, the differences among the electronic affinities of the materials of the layers determine the characteristics of the energy barriers.

As the energy barriers become larger, the movement of carriers (holes or electrons) between layers is less likely to occur and the EL element therefore requires a higher driving voltage in order to gain the desired brightness.

In view of this fact, an organic EL element according to the invention is designed such that a doping material, whose ionization potential is lower than that of the material of the hole transport layer and higher than that of the material of the hole injecting electrode layer, is added into the hole transport layer at a region near the interface between the hole transport layer and the hole injecting electrode. This allows smooth hole movement between layers, and as a result, the driving voltage for the organic EL element can be reduced.

Figure 2:
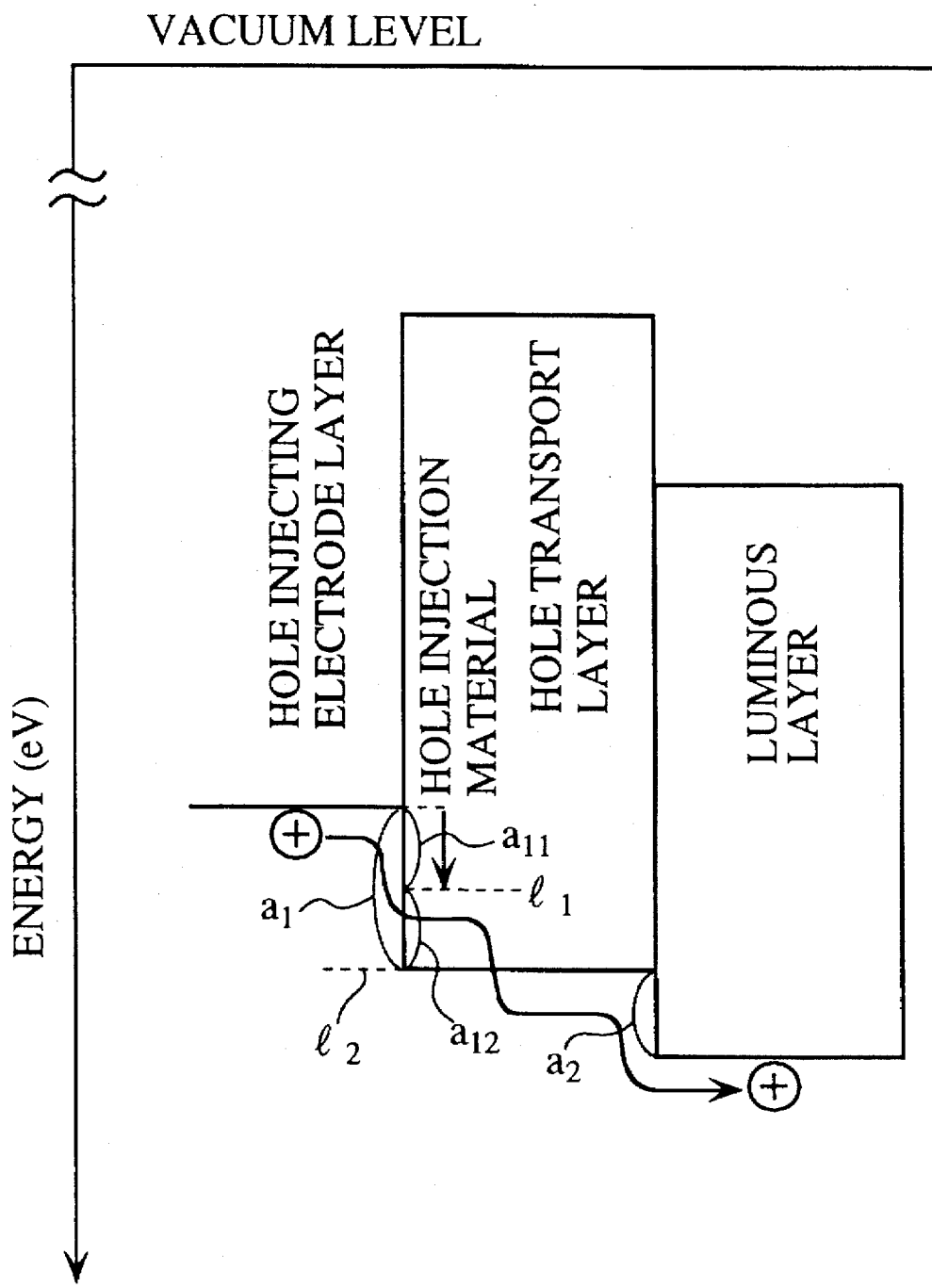
FIG. 2 is a diagram illustrating the behavior of carriers in an organic EL element doped with a hole injection material.

FIG. 2 shows the behavior of the carriers in the organic EL element doped with the hole injecting material. FIG. 2 particularly shows an energy diagram of a region where the hole injecting electrode layer, the hole transport layer, and the luminous layer are laminated in order, and other regions such as the electron transport layer and the electron injecting electrode layer are omitted. The hole transport layer in FIG. 2 is doped with the hole injection material on the side close to the hole injecting electrode layer.

It is to be understood from FIG. 2 that a barrier a1 between the hole injecting electrode and the hole transport layer curves gently, being divided into barriers a11 and a12, because the hole injection material has an ionization potential which is lower than that of the hole transport layer and larger than that of the hole injecting electrode.

In the organic EL element of the invention, holes moving from the hole injecting electrode layer to the hole transport layer are once caught by an energy level 11 formed by the hole injection material and then move from the energy level 11 to an energy level 12 of the hole transport layer, whereas the holes of the prior art have to cross the energy barrier a1.

In such an organic EL element of the invention, the scale of barriers and therefore the driving voltage required for emission can be reduced.

According to the organic EL element of the invention, the hole injection material receives holes from the hole injecting electrode layer and passes them to the hole transport layer, on the molecule basis, so that the hole injection material does not need high hole movability as a mass.

On the other hand, the hole injecting layer of the prior art is fabricated in the form of a layer, so that high hole movability is required for transporting holes, in addition to ionization potential necessary for dividing energy barriers. However, the hole injection material of the invention does not require high hole movability by itself, since it simply passes holes from the electrode to the hole transport layer.

Further, there is no need to form the hole injection material into a thin film in the invention, because the hole injection material added into the hole transport layer is dispersed within the hole transport layer. In addition, even if the hole injection material is comparatively easily crystallized, it can be used in this invention.

In the prior art, if a material which absorbs visible radiation is used for the hole injecting layer, the layer serves as a color filter, causing a change in the color of emitted radiation and a decrease in the brightness. On the other hand, when the hole injection material is dispersed as is the case of the invention, the hole injection material has a very small number of molecules, compared to the case where it is fabricated in the form of a layer, and therefore even if the hole injection material used in the invention absorbs visible radiation, it has little effect on the optical characteristics of the organic EL element.

Accordingly, the material of the hole injecting layer of the invention does not need to meet various conditions and therefore can be selected from a broad range. This contributes to the realization of the organic EL element capable of operating at a lower driving voltage.

In addition, the hole injection material contained in the hole transport layer in a dispersed condition restricts the crystallization of the hole transport layer itself, so that its film quality remains stable.

Referring now to the drawings, preferred embodiments of the invention will be hereinafter described in detail.

EXAMPLE 1

This example provides elements A1, A2, in each of which the hole transport layer is entirely doped with a hole injection material.

Figure 3:
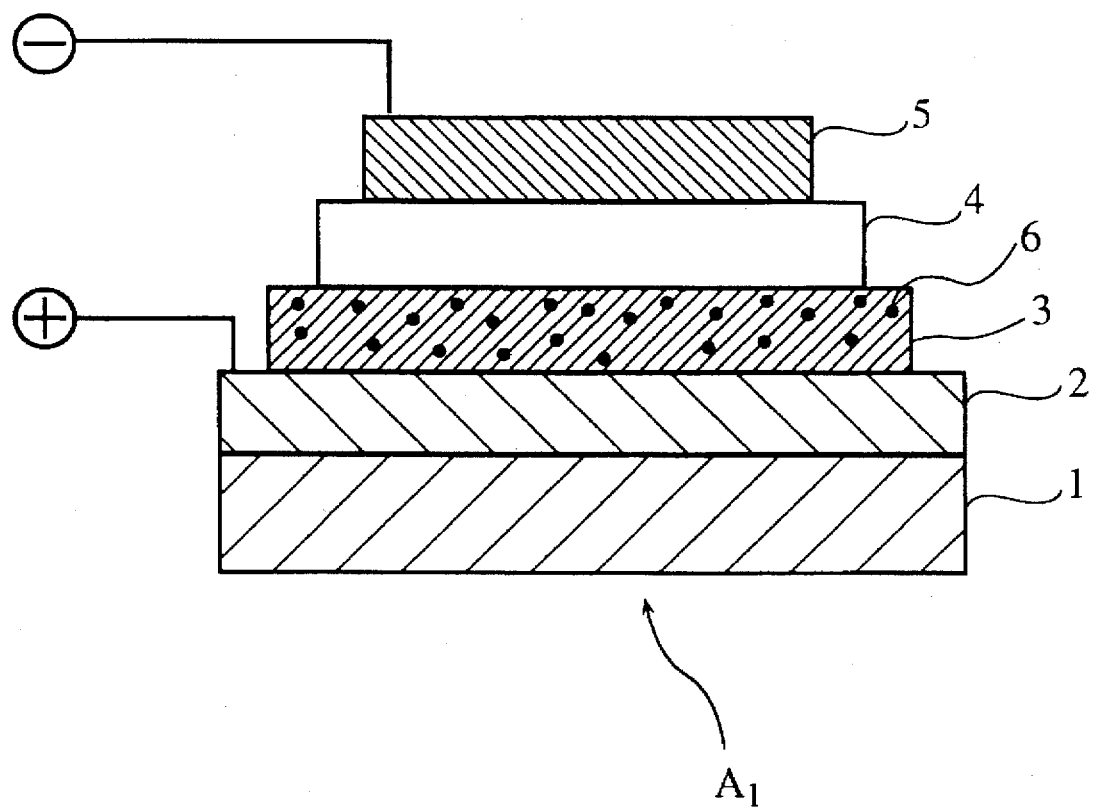
FIG. 3 is a sectional diagram of an element A1 according to Example 1.

FIG. 3 schematically illustrates a section of the element A1 of Example 1. The element A1 comprises a glass substrate 1 on which a hole injecting electrode layer 2, a hole transport layer 3, a luminous layer 4 and an electron injecting layer 5 are formed in order. The hole injecting electrode layer 2 has a thickness of 1,000 Å (Angstrom) and is made from In—Sn oxide (ITO, ionization potential: 4.5 eV). The hole transport layer 3 has a thickness of 500 Å and is made from N, N'-diphenyl-N, N'-bis(3-methylphenyl)1, 1'-biphenyl-4, 4'-diamine (see Chemical Formula 1) (hereinafter referred to as "MTPD", ionization potential: 5.4 eV). The luminous layer 4 has a thickness of 500 Å and is made from tris(8-hydroxyquinoline)aluminum (see Chemical Formula 2). The electron injecting electrode layer 5 has a thickness of 2000 Å and is made from a Mg—In alloy. The hole transport layer 3 is doped with 5 wt % of a hole injection material 6. A lead is connected to each of the hole injecting electrode layer 2 and the electron injecting electrode layer 5 and voltage can be applied through these leads.

[Chemical Formula 1] MTPD

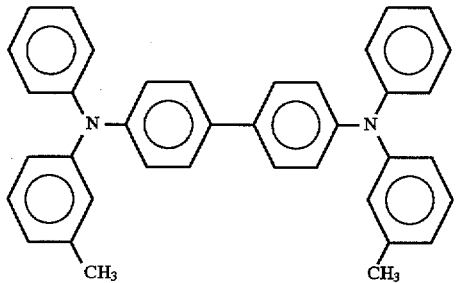

[Chemical Formula 2] TRIS (8-HYDROXYQUINOLINE) ALUMINUM

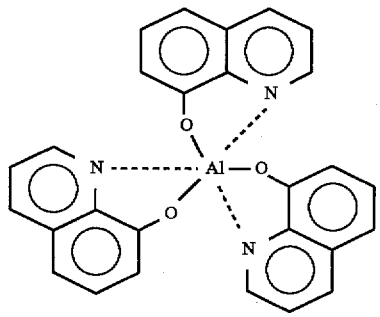

The hole injection material 6 should be selected according to the ionization potential of the hole injecting electrode layer 2 and that of the hole transport layer 3. In this example, the amine compound (ionization potential: 5.0 eV) represented by the following Chemical Formula 3 is added throughout the hole transport layer 3. The density of the hole injection material 6 is 5 wt % with respect to the hole transport layer 3.

[Chemical Formula 3] CARBAZOLE DIOXAZINE

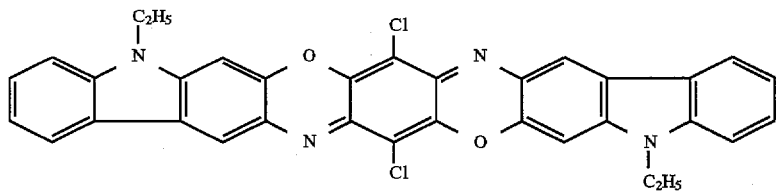

It is understood from the above description that the ionization potential of the hole injection material 6 (5.0 eV) is lower than that of the hole transport layer 3 (5.4 eV) and higher than that of the hole injecting electrode layer 2 (4.5 eV). The ionization potential of each material herein was obtained in such a way that: each material underwent vapor deposition to form an evaporated film and the ionization potential of each material was obtained from its evaporated film by the photoelectron spectroscopy.

The manufacturing method for the organic EL element of the invention will be described below.

The glass substrate 1 having an In-Sn compound film (which will be the hole injecting electrode layer 2) formed thereon is first washed with a neutral detergent and then undergoes ultrasonic cleaning, in acetone for 20 minutes and in ethanol for 20 minutes. Then, MTPD and the amine compound (Chemical Formula 3) are overlaid on the hole injecting electrode layer 2 and vacuum-deposited such that the density of the amine compound with respect to MTPD is 5 wt %, whereby the hole transport layer 3 doped with the hole injection material 6 is formed.

After tris(8-hydroxyquinoline)aluminum has been vacuum-deposited on the hole transport layer 3, to form the luminous layer 4, the electron injecting electrode layer 5 made from Mg—In alloy is formed on the luminous layer 4 by vapor deposition.

Note that the vacuum deposition in the above process is carried out under the conditions that the degree of vacuum is $1.10^{-5}$ Torr, the substrate temperature is 20° C. and the depositing speed of the organic layers is 2A/sec.

Comparative Example

An element X used in this comparative example has the same structure as the element A1, except that the former does not contain the hole injection material 6 within the hole transport layer 3.

Test

Tests were conducted on the element A1 and the element X to check their current density-voltage characteristics and their brightness-current density characteristics. The tests were carried out under the following conditions.

Current density-voltage characteristic: Voltage gradually increased at a rate of 0 to 1 volt was applied across the electrode layers. Current density for each voltage value was measured.

Brightness-current density characteristic: Changes in brightness against current density were measured when voltage was applied across the electrode layers under the same condition as described in the column of "current density-voltage characteristic".

Figure 4:
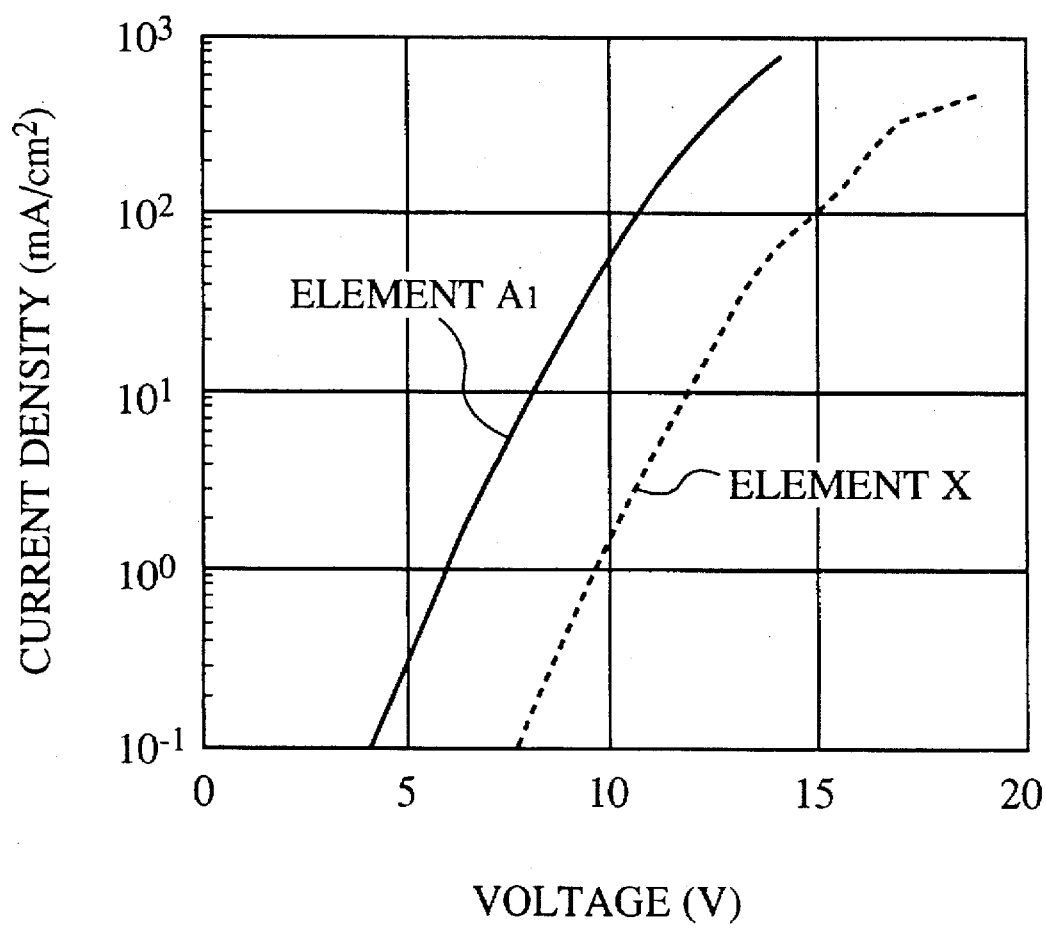
FIG. 4 is a graph showing the current density versus voltage for the element A1 and that for an element X.
Figure 5:
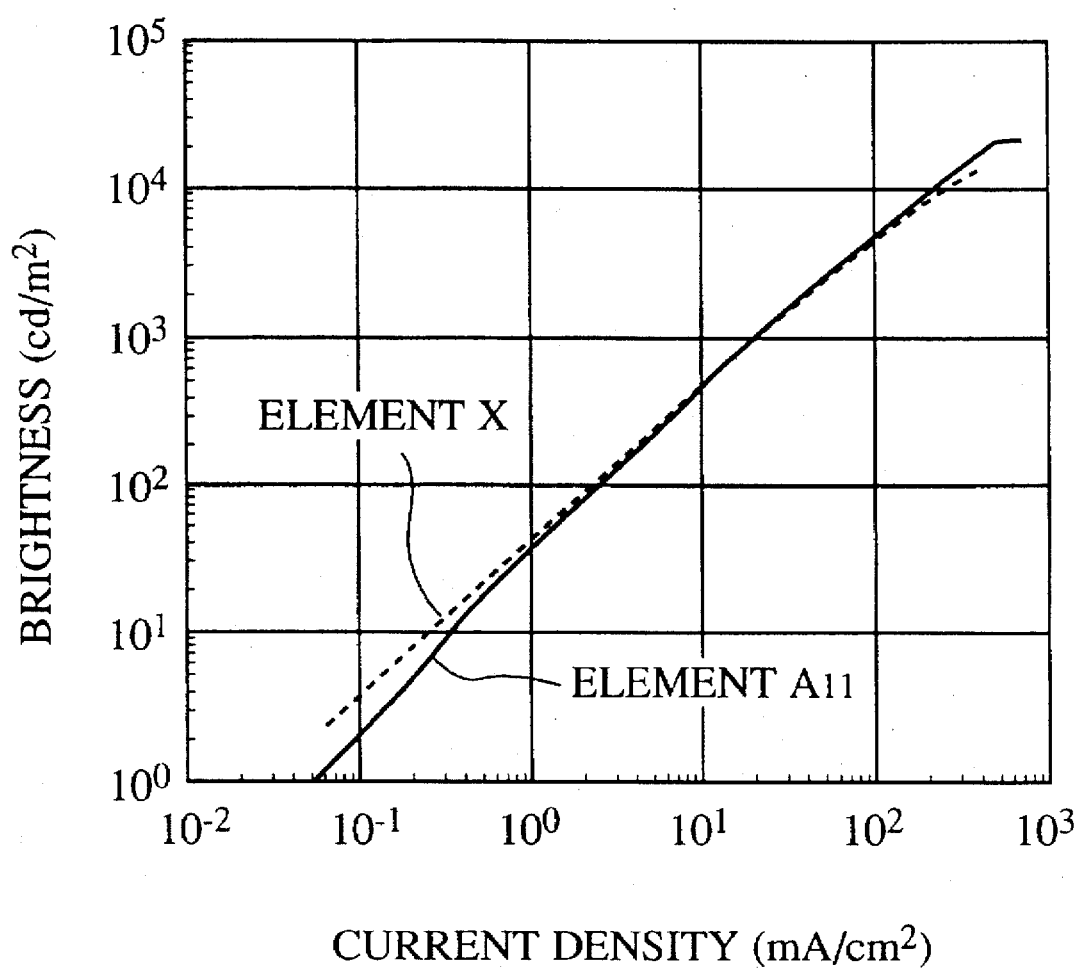
FIG. 5 is a graph showing the brightness versus current density for the element A1 and that for the element X.

Test results are shown in FIGS. 4 and 5.

It is obvious from FIG. 4 that the current flowing in the element A1 when voltage is applied is very high, compared to the element X. For example, when obtaining a current density of 10 mA/cm$^2$, the element X needs about 12 volts whilst the element A1 needs a lower voltage, i.e., about 8 volts. Thus, the element A1 succeeds in reducing the voltage by about 34%.

Regarding the brightness-current density characteristic, the elements A1 and X exhibit substantially the same brightness as shown in FIG. 5.

Therefore, the voltage required by the element A1 at the start of emission (i.e., the driving voltage when the brightness is 1 cd/cm$^2$) is much less than that of the element X. Concretely, the former is 3.5 eV, whilst the latter is 6.6 eV.

It is understood from FIG. 5 that the maximum brightness of the element X is 16,100 cd/m$^2$, whilst that of the element A1 is 21,100 cd/m$^2$. It can be found from calculation based on these measuring results that the maximum luminous efficiency of the element A1 (=2.22 1 m/W) is much higher than that of the element X (=1.56 lm/W).

The organic EL element A2 has the same structure as the organic EL element A1, but differs in that the element A2 employs pentacene (see Chemical Formula 4) having an ionization potential of 5.1 eV as the hole injection material 6 and that the pentacene content is about 2 wt % with respect to MTPD.

[Chemical Formula 4] Eu(TTA)$_3$phen

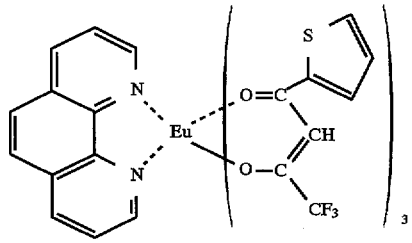

When the current density-voltage characteristic, and brightness-current density characteristic of the organic EL element A2 were measured, it was found that the element A2 operates at a low driving voltage and achieves an improvement in luminous efficiency. Also, the emission starting voltage of the element A2 proved to be low, i.e., about 3.3 V.

The organic EL elements A1, A2 can reduce their driving voltages required for emission and increase their emission efficiencies, for the following reason.

In the prior art element X, the energy barrier between the layers associated with the movement of holes (that is, the difference between the ionization potential of the hole injecting electrode layer and that of the hole transport layer) is about 0.9 eV, whereas the difference between the ionization potential of the hole transport layer and that of the luminous layer is about 0.2 eV. It can be assumed from this fact that the speed of hole movement is dependent mainly on the difference between the ionization potentials (i.e., energy barrier) of the hole injecting electrode layer and the hole transport layer.

Therefore, the hole injection material 6 is added into the hole transport layer 3 of the element A1 and A2 to reduce the energy barrier. This allows holes injected from the hole injecting electrode layer 2 to flow into the hole transport layer 3 after passing the hole injection material 6. Specifically, since the energy barrier existing between the hole injecting electrode layer 2 and the hole transport layer 3 is lessened by doping the hole injection material 6, holes can be smoothly injected into the hole transport layer 3.

EXAMPLE 2

This example shows elements A3, A4, in each of which only a region near the interface between the hole transport layer and the hole injecting electrode is doped with the hole injection material.

The elements A3, A4 have the same structure as the elements A1, A2 of Example 1, except that the hole injection material 6 is added only into a region within the hole transport layer 3, the region being near the interface between the hole transport layer 3 and the hole injecting electrode layer 2. The region doped with the hole injection material 6 is about 250 Å deep, extending from the interface between the hole injecting electrode layer 2 and the hole transport layer 3 towards the interior side of the hole transport layer 3.

When the current density-voltage characteristics, and brightness-current density characteristics of the elements A3, A4 were measured, it was found that improvements in these characteristics as well as an emission starting voltage of about 4.1 volts were achieved by these elements A3, A4.

Since the same effects can be achieved by adding the hole injection material 6 only to the region which is within the hole transport layer 3 and near the interface between the hole transport layer 3 and the hole injecting electrode layer 2, undesirable situations arising when the hole transport layer 3 is entirely doped with the hole injection material 6 can be avoided. Specifically, when particular kinds of materials are used as the hole injection material 6 or when the hole injection material 6 is added at some rates in "entire doping", hole movability within the hole transport layer 3 deteriorates, or the hole injection material 6 receives carriers or energy from the luminous layer 4 with the result that emission is considerably impaired. Such problems can be solved by doping only the region near the interface between the hole transport layer 3 and the hole injecting electrode layer 2.

While the region doped with the hole injection material 6 within the hole transport layer 3 in each of the elements A3, A4 has a depth of about 250 Å, it is readily apparent that the depth of the region is not limited to this, but may be set to an arbitrary value below the thickness of the hole transport layer 3.

EXAMPLE 3

This example provides an organic EL element A5, in which the hole transport layer is doped with the hole injection material made from a mixed material.

The element A5 has the same structure as the elements A1, A2 of Example 1, but differs in that the hole injection material 6 used for the element A5 is made from a mixture of the amine compound (Chemical Formula 3) and pentacene (Chemical Formula 4) and the density of each compound is about 5 wt % with respect to MTPD.

It has been found that reduction in driving voltage and a low emission starting voltage (about 3.2 volts) can be achieved by the element A5.

Obviously, even if a mixture of a plurality of compounds is used as the hole injection material, the same effects can be achieved. The use of a plurality of compounds having different ionization potentials allows the energy barrier between the hole injecting electrode layer 2 and the hole transport layer 3 to be further divided, so that further reduction in driving voltage can be expected.

EXAMPLE 4

This example shows an organic EL element A6, in which its hole transport layer 3 is doped with the hole injection material such that a gradient of density is formed.

The element A6 has the same structure as the element A1 of Example 1, except that the hole injection material 6 (the amine compound (Chemical Formula 3)) is added to the hole transport layer 3 with a gradient of density so that the density of the hole injection material 6 is high on the side of the hole injecting electrode layer 2 (99.99 wt % at the interface with the hole injecting electrode layer 2) and low on the side of the luminous layer 4 (0 wt % at the interface with the luminous layer 4).

It has been found that the element A6 having such a structure achieves reduction in driving voltage and an improvement in luminous efficiency and that the emission starting voltage required for the element A6 is about 3.5 volts.

Since a larger amount of the hole injection material 6 exists on the side of the hole injecting electrode layer 2 when the gradient of density is provided, the hole injection material functions effectively even if current increases, so that resistance can be lessened and the driving voltage can be reduced.

Others

Although the amine compound (Chemical Formula 3) and pentacene are used as the hole injection material in Examples 1 to 4, it is obvious that the hole injection material is not limited to them, but could be selected from various compounds. Table 1 provides other materials that can be suitably used as the hole injection material.

TABLE 1

| MATERIALS | WORK FUNCTION IONIZATION POTENTIAL(eV) |
|---|---|
| CARBAZOLE DIOXAZINE (Chemical Formula 5) | 5.0 |
| Eu(TTA)$_3$phen (Chemical Formula 6) | 5.0 |
| COPPER PHTHALOCYANINE (Chemical Formula 7) | 5.0 |
| NK-757 (Chemical Formula 8) | 5.1 |
| FLAVANTHRONE (Chemical Formula 9) | 5.2 |
| LEUCO CRYSTAL VIOLET (Chemical Formula 10) | 5.2 |
| LEUCO MALACHITE GREEN (Chemical Formula 11) | 5.3 |
| NAPHTHACENE (Chemical Formula 12) | 5.3 |
| DECACYCLENE (Chemical Formula 13) | 5.3 |

[Chemical Formula 5] CARBAZOLE DIOXAZINE
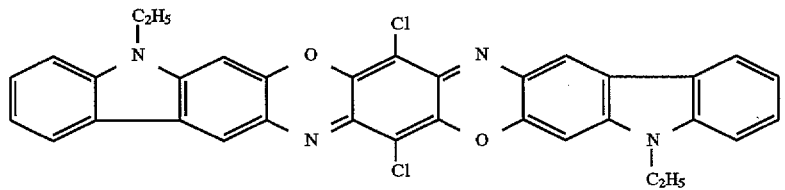
[Chemical Formula 6] Eu(TTA)₃phen
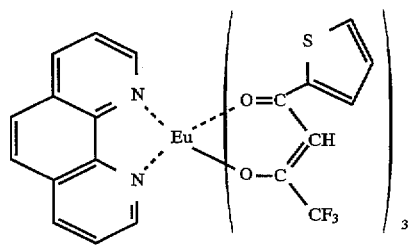
[Chemical Formula 7] COPPER PHTHALOCYANINE
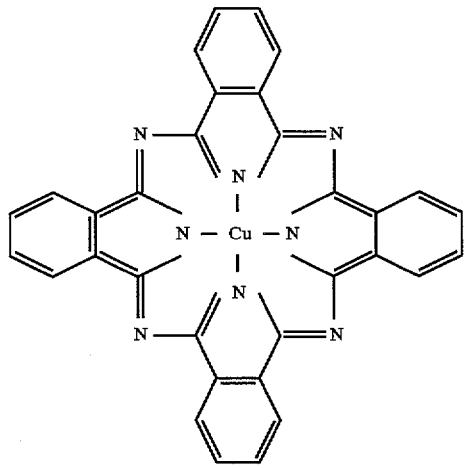
[Chemical Formula 8] NK-757
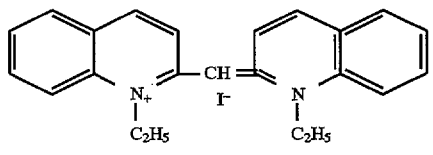
[Chemical Formula 9] FLAVANTHRONE
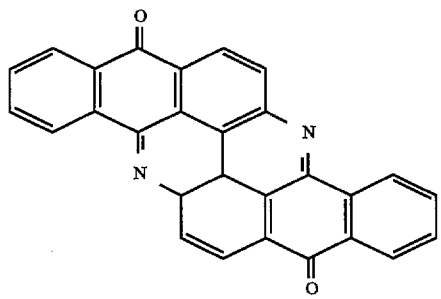
[Chemical Formula 10] LEUCO CRYSTAL VIOLET
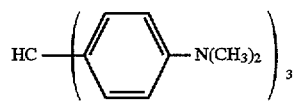
[Chemical Formula 11] LEUCO MALACHITE GREEN
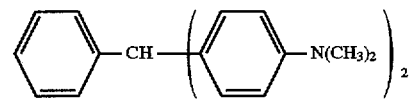

[Chemical Formula 12] NAPHTHACENE

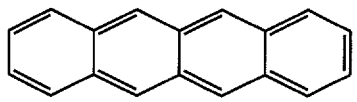

-continued

[Chemical Formula 13] DECACYCLENE

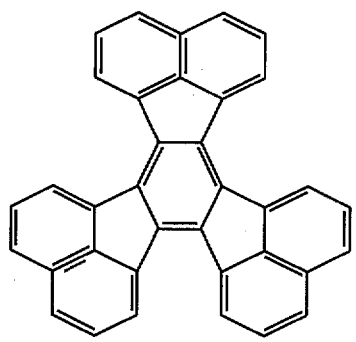

Although about 5 wt % or 2 wt % of the hole injection material is used for doping in Examples 1 to 4, the density of the hole injection material is not limited to them, but may be in the range of 0.01 wt % to 99.99 wt % to achieve the same effects.

Although the invention has been particularly described with SH-A structured elements in Examples 1 to 4, other structured elements may be employed. For example, when a DH structured element is used, the same effects can be achieved by doping the hole transport layer with the hole injection material like Examples 1 to 4. In the case of a SH-B structured element, the same effects may be achieved by doping the luminous layer, which also serves as the hole transport layer, with the hole injection material.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be constructed as being included therein.

What is claimed is:

1. An organic electroluminescent element comprising a hole transport layer and a luminous layer between an opposed hole injecting electrode layer and electron injecting electrode layer, the hole transport layer being overlaid on the hole injecting electrode layer,
    wherein the hole transport layer is doped with a hole injection material at least at a region in contact with the hole injecting electrode layer, the hole injection material having an ionization potential which is lower than that of the hole transport layer and higher than that of the hole injecting electrode layer.

2. An organic electroluminescent element according to claim 1, wherein the hole transport layer is doped with the hole: injection material such that the density of the hole injection material gradually decreases from the hole injecting electrode side towards the electron injecting electrode side.

3. An organic electroluminescent element according to claim 1, wherein the hole transport layer is doped with the hole injection material only at the region in contact with the hole injecting electrode.

4. An organic electroluminescent element according to claim 1, wherein the hole injection material is selected from a group consisting of an amine compound, pentacene, carbazole dioxazine, Eu(TTA)3phen, copper phthalocyanine, NK-757(1-ethyl-2-[(1-ethyl-2(1H)-quinolylidene)methyl] quinolinium iodide), flavanthrone, leuco crystal violet, leuco malachite green, naphthacane and decacyclene which are described by Chemical Formulas 101 to 111, respectively.

[Chemical Formula 101]

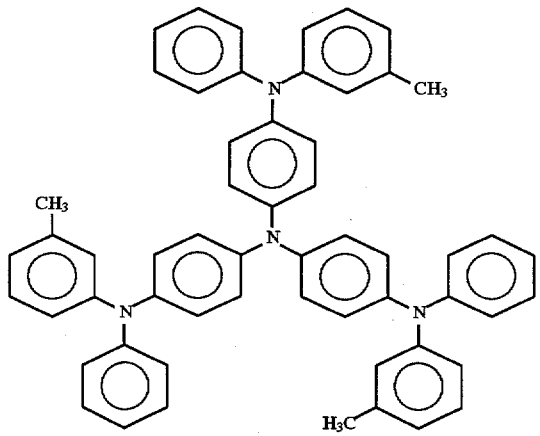

[Chemical Formula 102]

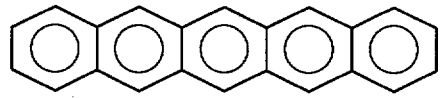

[Chemical Formula 103]
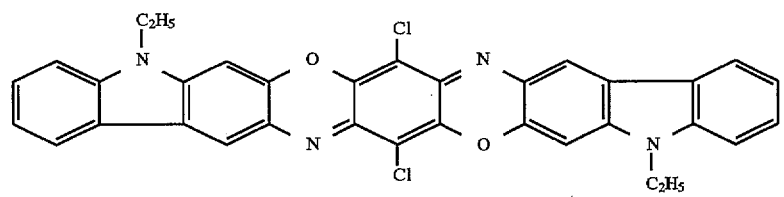
[Chemical Formula 104]
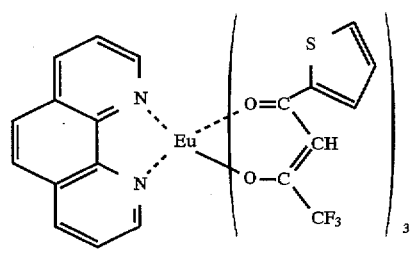
[Chemical Formula 105]
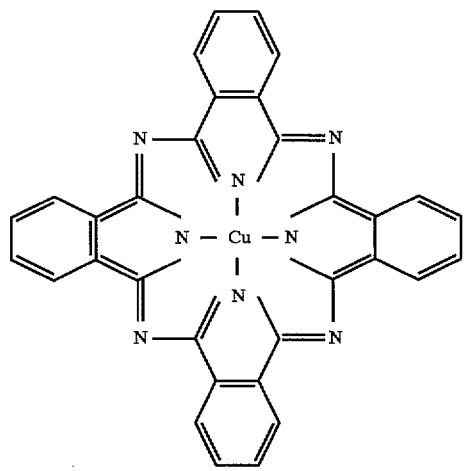
[Chemical Formula 106]
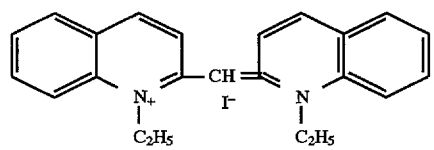
[Chemical Formula 107]
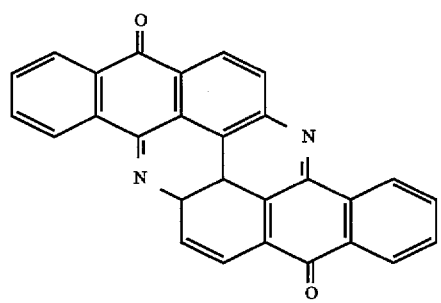
[Chemical Formula 108]
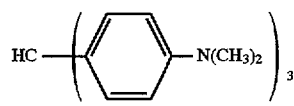
[Chemical Formula 109]
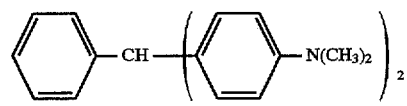
[Chemical Formula 110]
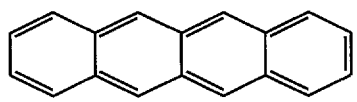
[Chemical Formula 111]
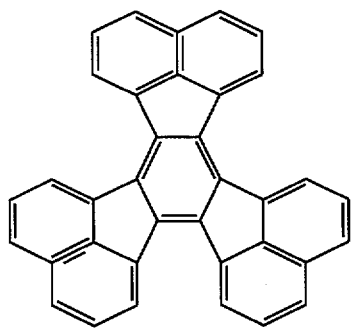

5. An organic electroluminescent element according to claim 1, wherein the hole transport layer is doped with a plurality of hole injection materials at least at a region in contact with the hole injecting electrode, each of the hole injection materials having an ionization potential which is lower than that of the hole transport layer and higher than that of the hole injecting electrode layer.

6. An organic electroluminescent element according to claim 5, wherein the plurality of hole injection materials are selected from a group consisting of an amine compound, pentacene, carbazole dioxszine, Eu(TTA)3phen, copper phthalocyanine, NK-757(1-ethyl-2[(1-ethyl-2(1H)-quinolylidene)methyl]quinolinium iodide), flavanthrone, leuco crystal violet, leuco malachite green, naphthacene and decacyclene which are described by Chemical Formulas 112 to 122, respectively

[Chemical Formula 112]

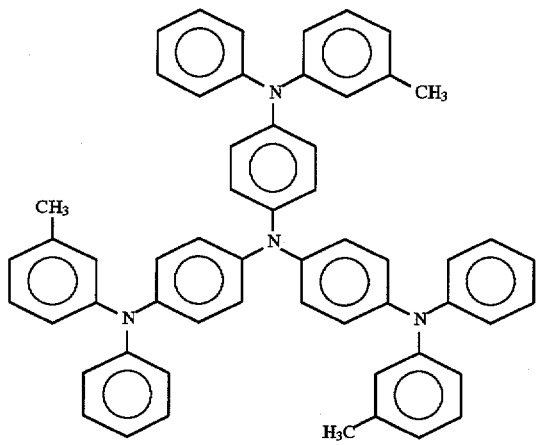

[Chemical Formula 113]

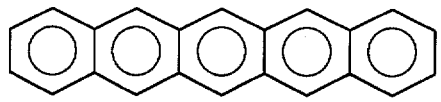

[Chemical Formula 114]

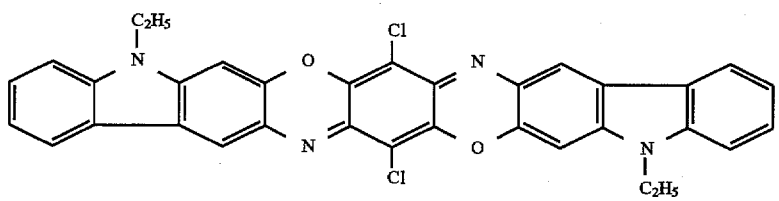

[Chemical Formula 115]

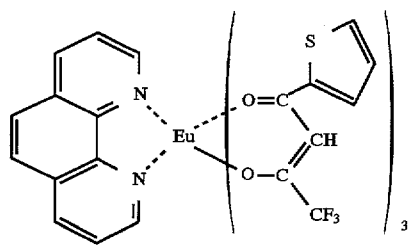

[Chemical Formula 116]

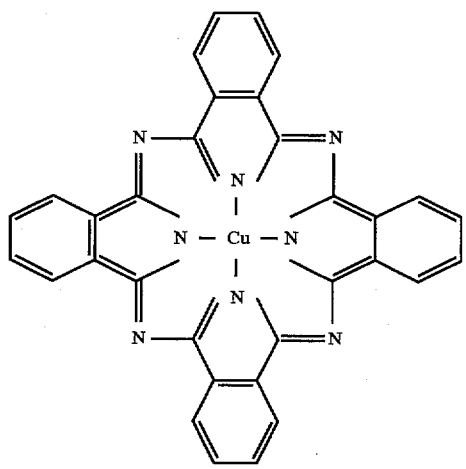

[Chemical Formula 117]

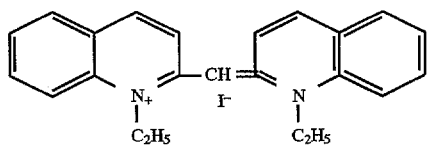

[Chemical Formula 118]

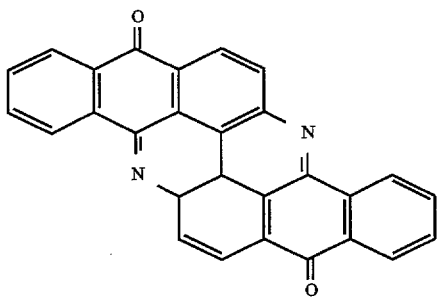

[Chemical Formula 119]

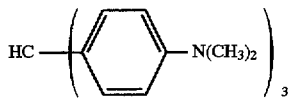

[Chemical Formula 120]

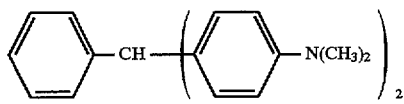

[Chemical Formula 121]

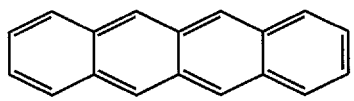

[Chemical Formula 122]

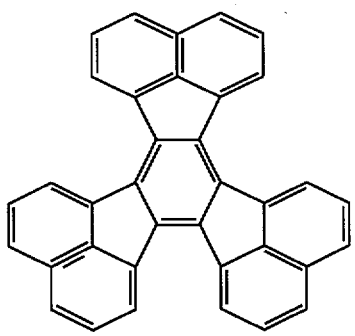

7. An organic electroluminescent element according to claim 1, wherein an electron transport layer is further interposed between the opposed hole injecting electrode layer and electron injecting electrode layer.

8. An organic electroluminescent element comprising a luminous layer and an electron transport layer between an opposed hole injecting electrode layer and electron injecting electrode layer, the luminous layer being overlaid on the hole injecting electrode layer, wherein the luminous layer is doped with a hole injection material at least at a region in contact with the hole injecting electrode layer, the hole injection material having an ionization potential which is lower than that of the luminous layer and higher than that of the hole injecting electrode layer.

9. An organic electroluminescent element according to claim 8, wherein the luminous layer is doped with the hole injection material such that the density of the hole injection material gradually decreases from the hole injecting electrode side towards the electron injecting electrode side.

10. An organic electroluminescent element according to claim 8, wherein the luminous layer is doped with the hole injection material only at the region in contact with the hole injecting electrode.

11. An organic electroluminescent element according to claim 8, wherein the hole injection material is selected from a group consisting of an amine compound, pentacene, carbazole dioxazine, Eu(TTA)3phen, copper phthalocyanine, NK-757(1-ethyl-2-[(1-ethyl-2(1H)-quinolylidene)methyl] quinolinium iodide), flavanthrone, leuco crystal violet, leuco malachite green, naphthacene and decacyclene which are described by Chemical Formulas 123 to 133, respectively

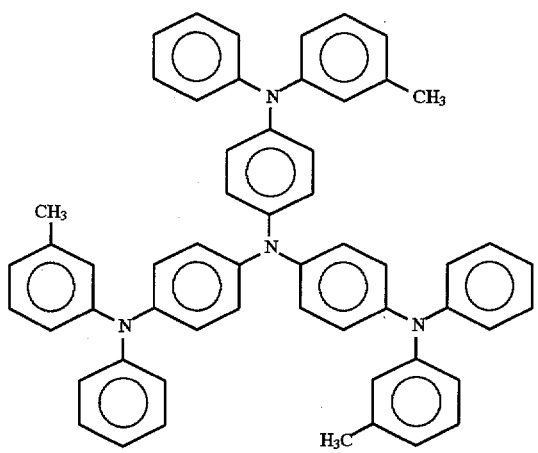
[Chemical Formula 123]
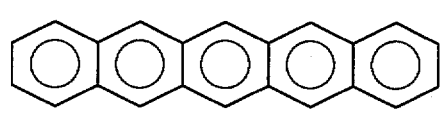
[Chemical Formula 124]
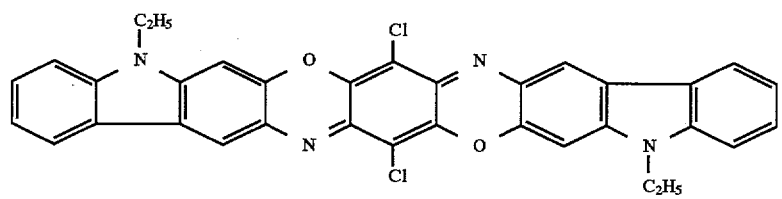
[Chemical Formula 125]
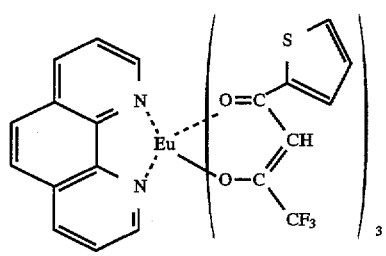
[Chemical Formula 126]
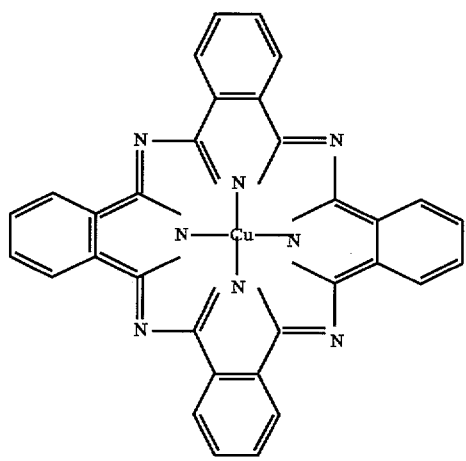
[Chemical Formula 127]
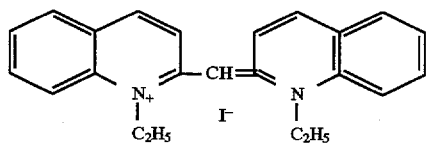
[Chemical Formula 128]

-continued

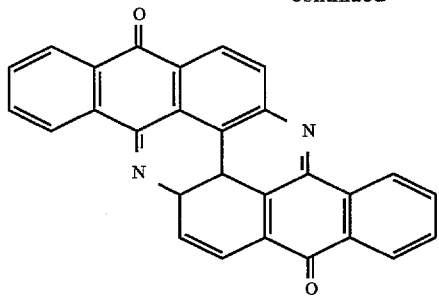

[Chemical Formula 129]

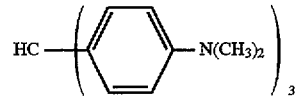

[Chemical Formula 130]

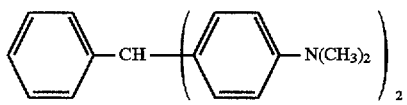

[Chemical Formula 131]

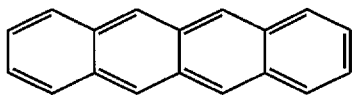

[Chemical Formula 132]

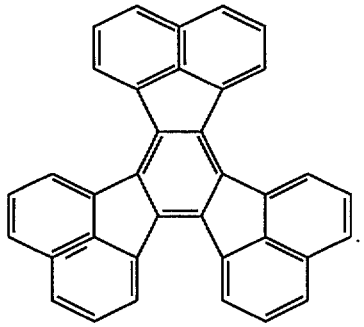

[Chemical Formula 133]

12. An organic electroluminescent element according to claim 8, wherein the luminous layer is doped with a plurality of hole injection materials at least at a region in contact with the hole injecting electrode, each of the hole injection materials having an ionization potential which is lower than that of the luminous layer and higher than that of the hole injecting electrode layer.

13. An organic electroluminescent element according to claim 12, wherein the hole injection material is selected from a group consisting of an amine compound, pentacene, carbazole dioxazine, Eu(TTA)3phen, copper phthalocyanine, NK-757(1-ethyl-2-[(1-ethyl-2(1H)-quinolylidene)methyl]quinolinium iodide), flavanthrone, leuco crystal violet, leuco malachite green, naphthacene and decacyclene which are described by Chemical Formulas 134 to 144, respectively

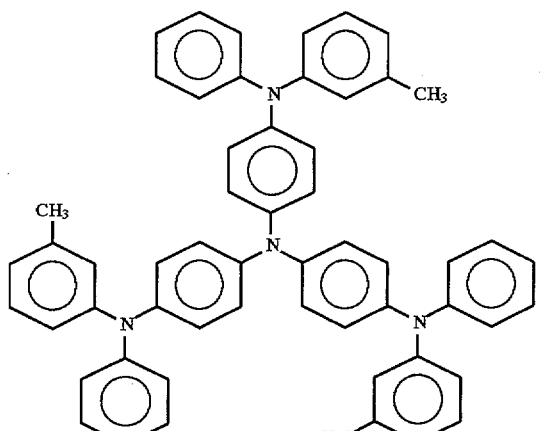
[Chemical Formula 134]
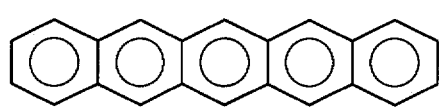
[Chemical Formula 135]
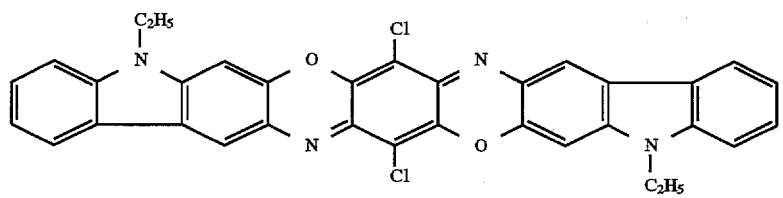
[Chemical Formula 136]
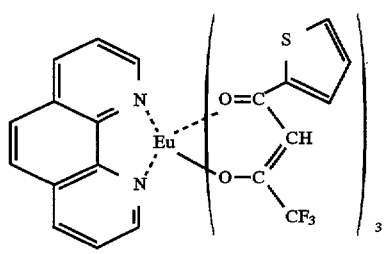
[Chemical Formula 137]
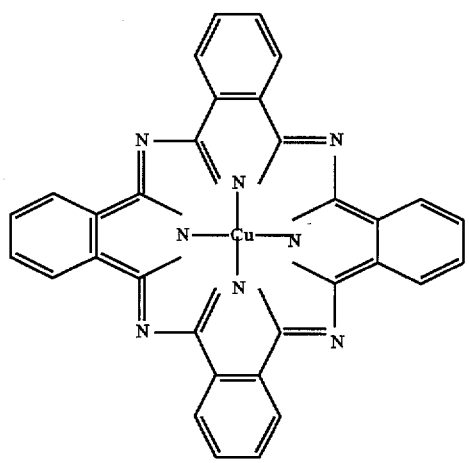
[Chemical Formula 138]
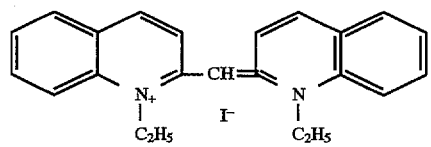
[Chemical Formula 139]

-continued

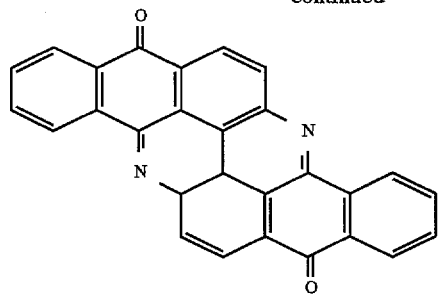

[Chemical Formula 140]

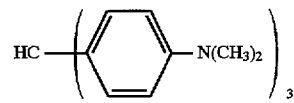

[Chemical Formula 141]

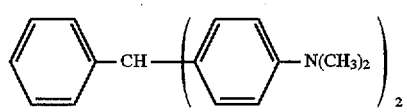

[Chemical Formula 142]

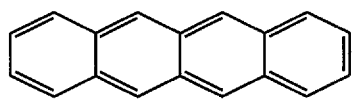

[Chemical Formula 143]

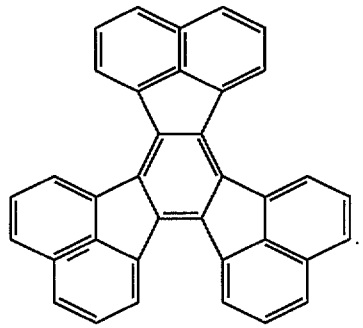

[Chemical Formula 144]

14. An organic electroluminescent element according to claim 8, wherein the luminous layer is a hole transport layer.

15. An organic electroluminescent element according to claim 14, wherein the luminous layer is doped with the hole injection material such that the density of the hole injection material gradually decreases from the hole injecting electrode side towards the electron injecting electrode side.

16. An organic electroluminescent element according to claim 14, wherein the luminous layer is doped with the hole injection material only at the region in contact with the hole injecting electrode.

17. An organic electroluminescent element according to claim 14, wherein the hole injection material is selected from a group consisting of an amine compound, pentacene, carbazole dioxazine, Eu(TTA)3phen, copper phthalocyanine, NK-757(1-ethyl-2-[(1-ethyl-2(1H)-quinolylidene)methyl]quinolinium iodide), flavanthrone, leuco crystal violet, leuco malachite green, naphthacene and decacyclene which are described by Chemical Formulas 145 to 155, respectively

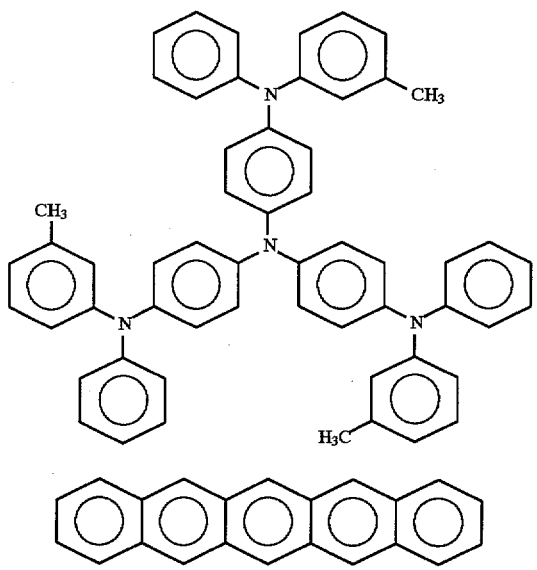
[Chemical Formula 145]
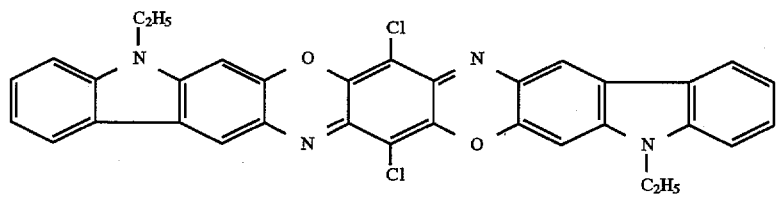
[Chemical Formula 146]
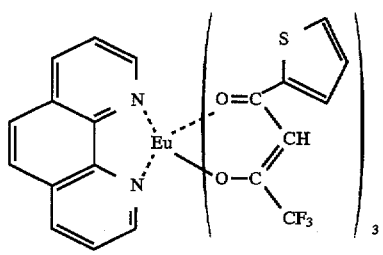
[Chemical Formula 147]
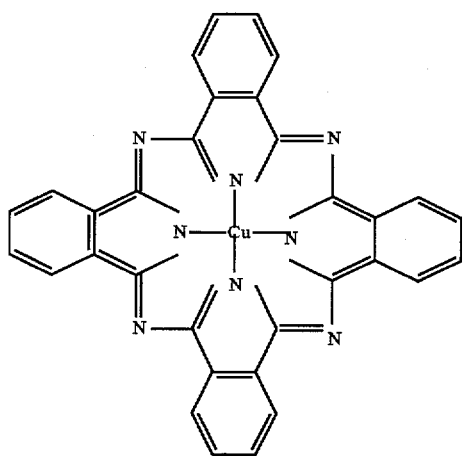
[Chemical Formula 148]
[Chemical Formula 149]
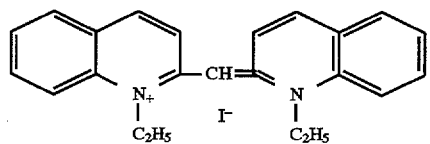
[Chemical Formula 150]

-continued
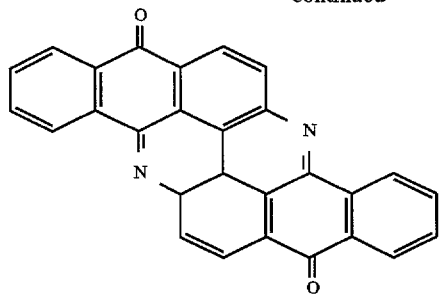
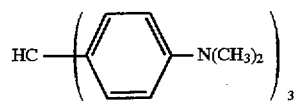
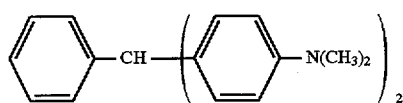
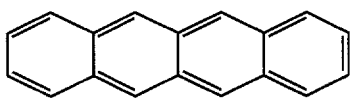
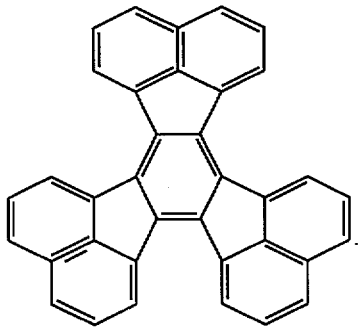
* * * * *
[Chemical Formula 151]
[Chemical Formula 152]
[Chemical Formula 153]
[Chemical Formula 154]
[Chemical Formula 155]